United States Patent [19]

Blonder et al.

[11] Patent Number: 5,380,551
[45] Date of Patent: Jan. 10, 1995

[54] VAPOR DEPOSITION PROCESS FOR COATING ARTICLES OF MANUFACTURE

[75] Inventors: Greg E. Blonder, Summit, N.J.; Mindaugas F. Dautartas, Alburtis, Pa.

[73] Assignee: AT&T Corp, Murray Hill, N.J.

[21] Appl. No.: 65,518

[22] Filed: May 21, 1993

Related U.S. Application Data

[63] Continuation of Ser. No. 808,704, Dec. 13, 1991, abandoned.

[51] Int. Cl.6 .................. B05D 5/06; B05C 13/00; C23C 16/40
[52] U.S. Cl. .................... 427/166; 427/167; 118/500
[58] Field of Search .......... 427/250, 248.1, 167, 427/166; 437/105; 148/DIG. 169; 118/500, 501

[56] References Cited

U.S. PATENT DOCUMENTS

| | | |
|---|---|---|
| Re. 30,626 | 5/1981 | Kaplan et al. |
| 2,026,203 | 12/1935 | Ackles ................................ 91/4 |
| 4,361,111 | 11/1982 | Groen ................................ 118/503 |
| 4,415,512 | 11/1983 | Torobin . |
| 4,704,298 | 11/1987 | Herman et al. . |
| 4,716,050 | 12/1987 | Green et al. ............................ 427/99 |
| 4,725,890 | 2/1988 | Yaniv et al. ............................ 358/285 |
| 4,916,091 | 4/1990 | Freeman et al. ....................... 437/238 |
| 4,933,561 | 6/1990 | Goransson et al. .................. 250/551 |
| 5,081,069 | 1/1992 | Parker et al. ......................... 437/235 |

OTHER PUBLICATIONS

Pierson, Hugh O., Chemically Vapor Deposited Coatings American Ceramic Society, p iii, 1981.
Morosanu, C. E. Thin Films by Chemical Vapor Deposition; Elsevier 1990 p. 19.
Morosanu, C. E. Thin Films by Chemical Vapor Deposition Elsevier 1990 pp. 42-43 & 50.
Powell, C. F. Vapor Deposition John Wiley & Sons 1966 p. 250.

Primary Examiner—Shrive Beck
Assistant Examiner—Bret Chen
Attorney, Agent, or Firm—Wendy W. Koba

[57] ABSTRACT

A method for providing an essentially uniform coating over the outer surface of an article of manufacture. In particular, a vapor deposition process is disclosed for coating relatively small articles, such as spheres which may be used as lenses in optical systems. The coating may comprise an anti-reflective or alternatively, reflective, material.

13 Claims, 2 Drawing Sheets

VAPOR DEPOSITION PROCESS FOR COATING ARTICLES OF MANUFACTURE this application is a continuation of application Ser. No. 07/808704, filed on Dec. 13, 1991, now abandoned.

BACKGROUND OF THE INVENTION

1. Technical Field

The present invention relates to a method of applying a coating to articles of manufacture and, more particularly, to a vapor deposition process for the application of such a coating.

2. Description of the Prior Art

In various manufacturing environments, the need may arise to apply a coating of material to a specific article of manufacture. Often, the article is extremely small, fragile, or of a shape which is difficult to coat with any degree of uniformity. In particular, many optical system applications require the use of a coated lens in the form of a spherical member. The spherical lens may be used to provide optical coupling through free space between two physically separated locations. For example, such a lens may be used between active optical device, such as a laser or LED, and an associated communication optical fiber. Conversely, a spherical lens may also be used to provide coupling between an optical fiber and a photodetector, such as a p-i-n photodiode. Regardless of the application, it is advantageous to minimize optical reflections associated with such spherical members, since reflections (at best) decrease the system coupling efficiency, and (at worst) degrade the operation of the active optical device.

In the past, spherical lenses have been coated with an anti-reflective (AR) material such as $MgF_2$, $SiO_2$, or other physical vapor deposited films. In particular, the spherical lenses would be loaded into a fixture and inserted in a barrel coating machine. The fixture would then be physically rotated to coat the spheres with the AR material. In order to coat both sides of the spheres, the process must be shut down and the fixture turned over. As a result, this coating process leaves a ring of uncoated surface around the middle of the device. Thus, when later utilizing the lens, orientation must be carefully controlled such that the uncoated ring portion is displaced out of the optical signal path. Another problem with the physical vapor deposition approach is the lack of uniformity of the AR coating, where this lack of uniformity affects the coupling efficiency of the lens. Further, the relatively small diameter of an individual sphere (for example, $<300$ $\mu m$) and the fragility of such a lens when fabricated out of certain materials (such as glass), results in a significant number of lenses being irreparably damaged during the coating process.

Therefore, a need remains in the art for a method of applying a uniform coating, such as an AR coating, to an article of manufacture, such as a spherical lens member.

SUMMARY OF THE INVENTION

The need remaining in the prior art is addressed by the present invention which relates to a method of applying a coating to an article of manufacture and, more particularly, to a vapor deposition process for the application of such a coating.

In one exemplary embodiment of the present invention, a plurality of articles are loaded onto a carrier and subjected to a vapor deposition process of a suitable material under conditions to provide a substantially uniform coating of the desired thickness. The uniformity is achieved by utilizing vapor deposition processes that favor heterogeneous film growth (which are minimally affected by gas flow dynamics) as compared to gas phase reactions and processes. The vapor deposition process may be a chemical vapor deposition process, molecular beam epitaxy process, atomic layer epitaxy process, or any other vapor deposition process suitable to provide the requisite uniformity.

For a specific embodiment, the articles may comprise spherical members. When utilized with spheres, a carrier may be formed to include a grid of trenches in the top surface thereof such that the lenses may be placed upon the top surface and rest upon only four individual points of contact (the contacts being $<<1$ $\mu m$ and formed by the intersection of the trenches). The utilization of such a carrier results in coating essentially the entire outer surface of each spherical member. Spheres of various sizes maybe simultaneously coated. In fact, a number of separate carriers, each including grids for supporting lenses of different sizes, may be processed simultaneously.

When utilized to apply an AR coating to a plurality of spherical lenses, the method may employ the chemical vapor deposition of an $SiO_2$ material such as DADBS (diacetoxyditertiarybutoxysilane). Advantageously, the method of the present invention may also be utilized to apply a reflective coating to a spherical member. In this case, the thickness of the deposited material is chosen to provide the desired degree of reflectivity. Alternatively, metals may be deposited from organo-metallic precursors to yield reflective metallic films.

An advantage of the technique of the present invention is that a large number of articles of manufacture may be simultaneously processed to form a coating layer with a predetermined uniformity, the vapor deposition process resulting in an extremely high yield for the coated articles.

Other and further advantages of the present invention will become apparent during the course of the following discussion and by reference to the accompanying drawings.

BRIEF DESCRIPTION OF THE DRAWING

Referring now to the drawings, where like numerals represent like parts in several views.

DETAILED DESCRIPTION

Figure 1:
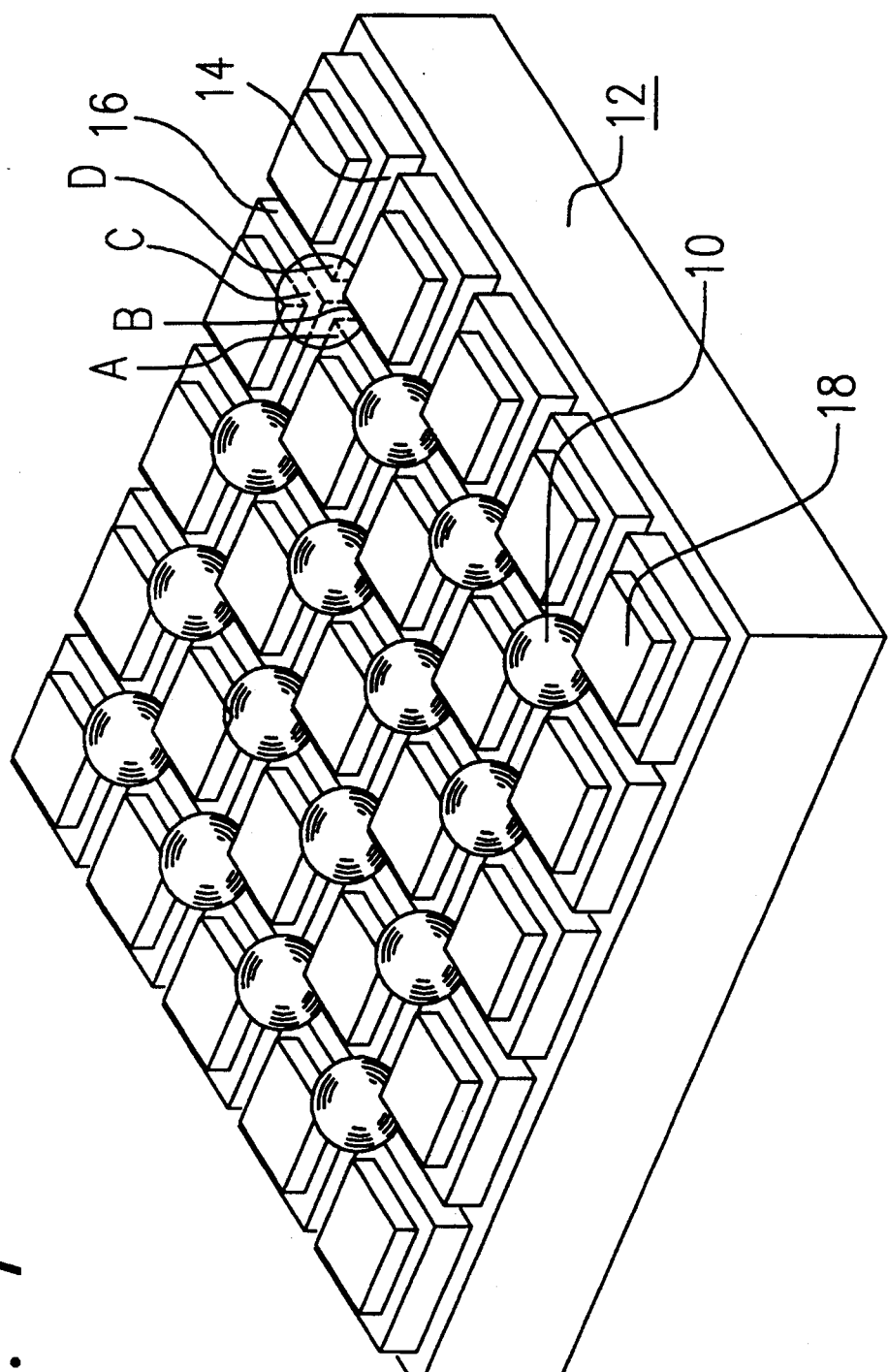
FIG. 1 illustrates a plurality of exemplary articles of manufacture, in the form of lenses, disposed on a carrier suitable for use in the method of the present invention.

FIG. 1 illustrates a plurality of spherical lenses 10 as positioned upon a carrier member 12 suitably formed to be used in association with the inventive method. It is to be understood that the coating process to be described hereinbelow is suitable for use with any desired article of manufacture and the following discussion directed to spherical members is for exemplary purposes only. Referring back to FIG. 1, member 12 contains a plurality of "horizontal" trenches 14 and a plurality of "vertical" trenches 16 formed in top surface 18 of member 12. The pluralities of trenches intersect to form the grid-like structure as shown in FIG. 1. The dimensions and spacing of trenches 14,16 are such that lenses 10 will rest therebetween with only four points of contact, denoted A, B, C and D in FIG. 1. As will be discussed hereinafter in association with FIGS. 2 and 3, trenches 14,16 may be formed as a bi-level structure to improve the stability of spheres 10 in carrier 12.

After spherical lenses 10 are loaded on carrier 12, carrier 12 is inserted in a reactor chamber (not shown) to begin the chemical vapor deposition of the coating material. Once the coating has been deposited to the desired thickness (as determined by processing parameters such as time and ambient temperature for CVD process, or the number of cycles for MBE or ALE processes), the carder is removed from the chamber. Coated lenses 10 may then be removed from carrier 12, using a "pick and place" tool, for example. Although points of contact A, B, C and D will not be coated, such has not been found to affect the optical properties of the coated lens, perhaps due to the relatively small contact point size (e.g., $<<1$ $\mu m$ for a 300 $\mu m$ sphere). It is to be noted that spheres of various dimensions may be simultaneously contacted and, further, several carriers may be processed simultaneously to further increase throughput.

EXAMPLE

Approximately 1000 sapphire spheres, each approximately 300 $\mu m$ in diameter, were loaded onto a carrier (approximately one inch square) as depicted in FIG. 1. The loaded carder was transferred into a reactor chamber and a DADBS $SiO_2$ layer was deposited. In practice, one reactor chamber may easily handle 10 to 50 carriers during each run. The chamber was maintained at a temperature of approximately 500° C. and the deposition was performed for approximately 26.5 minutes. The time and temperature parameters were calculated to yield an AR coating layer (for $\lambda = 1.3$ $\mu m$) approximately 2250Å thick.

Ellipsometry measurements on coated witness slides yielded an actual thickness of approximately 2222Å. Optical transmission and reflection measurements on the spheres gave results consistent with theory (i.e., transmissivity >98% and reflectivity <1%). Under optical microscope examination, no contact points were visible (with magnification greater than 400x). Measurements of several thousand spheres yielded spheres with transmissivity greater than 98%, regardless of orientation.

Figure 2:
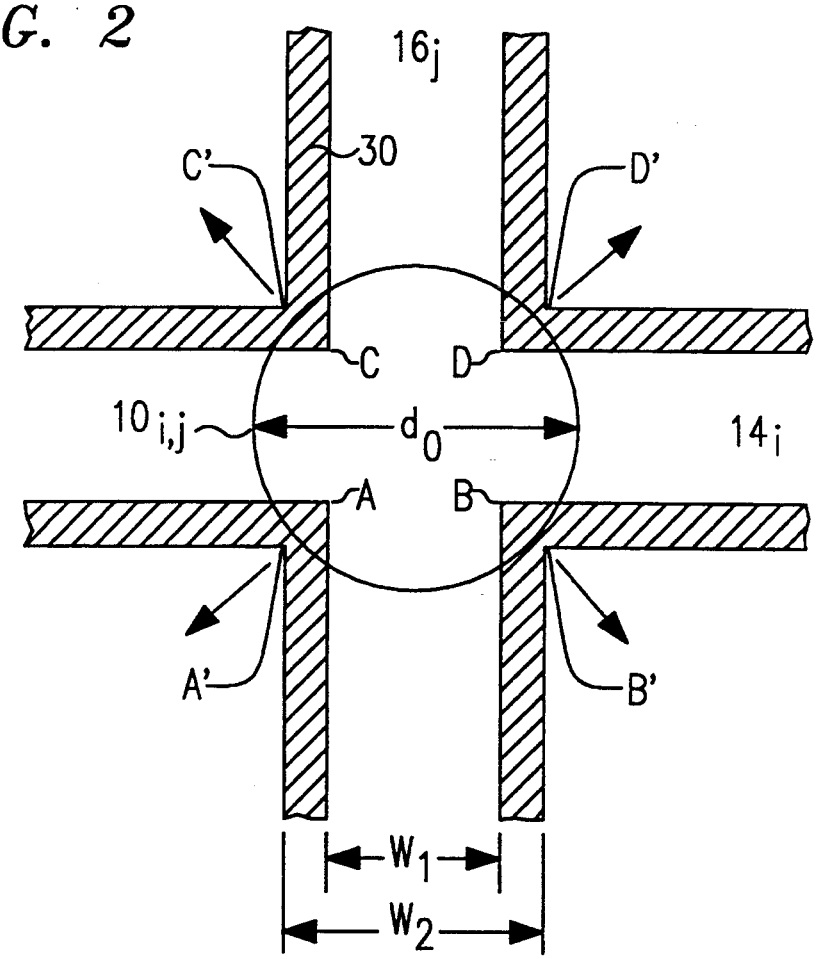
FIG. 2 is a top view of a portion of the arrangement of FIG. 1.
Figure 3:
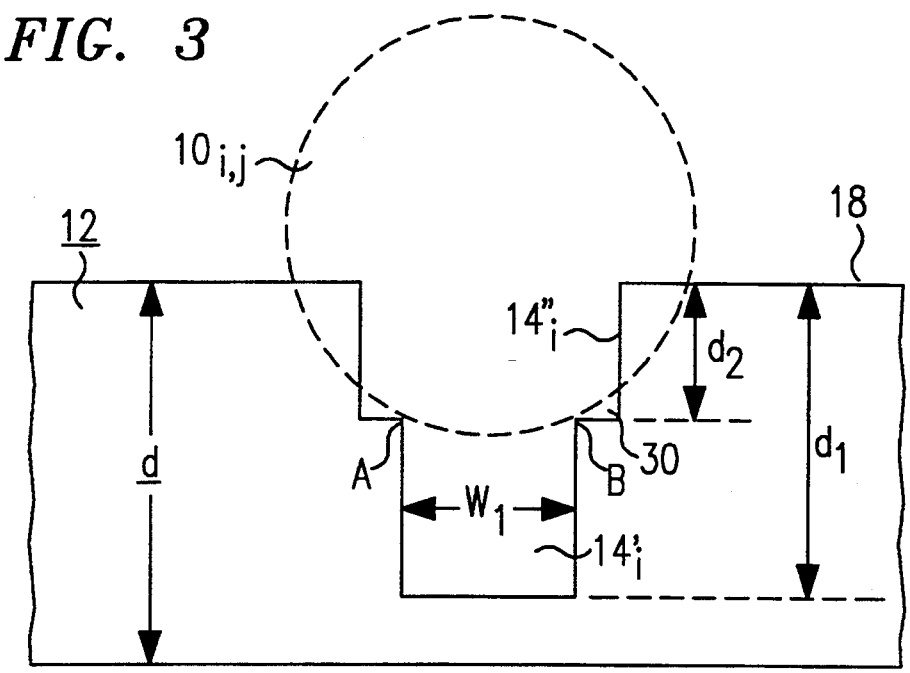
FIG. 3 is a cut-away side of the arrangement of FIG. 1.

It has been found, through experimentation, that improved stability of spheres on the trench structure of carrier 12 may result from the utilization of sets of bi-level trenches, as illustrated in particular in FIGS. 2 and 3. In the top view of FIG. 2, an exemplary sphere $10_{i,j}$ is illustrated as resting in the intersection of horizontal trench $14_i$ and vertical trench $16_j$. Each trench, in actuality, comprises a lower trench of width $w_1$ and an upper trench of width $w_2$, where $w_1$ is less than $w_2$. The widths are chosen such that a sphere of diameter D rest upon four points of contact A, B, C and D (A and B being the only visible points of contact in FIG. 3). The difference in width being chosen such that only slight motion of the spheres (indicated by the arrows in FIG. 2) will be tolerated before the spheres contact points A', B', C' or D' associated with the upper trenches.

As seen by the view in FIG. 3, lower horizontal trench $14'_i$ is formed to comprise a depth $d_1$ below top surface 18 of carrier 12. This depth is chosen such that sufficient flow of material through the trench during the vapor deposition coating process is maintained. Depth $d_2$ for upper trench $14''_i$ may be chosen such that approximately half of sphere $10_{i,j}$ remains above surface 18 of carrier 12.

It is to be noted that the above-described technique is equally applicable to forming a reflective coating on an article of manufacture, where such a reflective coating may be useful for some applications. Any suitable coating material, for example a metal such as aluminum or tungsten deposited from an organo-metallic precursor, may be used to form a reflective coating utilizing the vapor deposition method of the present invention. Further, as mentioned above, any suitable vapor deposition process, well-known to those skilled in the art, may be used in practicing the present invention including, but not limited to, chemical vapor deposition (CVD), molecular beam epitaxy (MBE) or atomic layer epitaxy (ALE).

We claim:

1. A method of coating a plurality of spherical members comprising the steps of:
    a) providing a plurality of spherical lenses,
    b) loading said plurality of spherical lenses onto a carrier support member comprising a grid of intersecting trenches formed in the top surface thereof such that each spherical lens is disposed at an intersection of a pair of trenches and is supported by four points of contact with said carrier;
    c) inserting the loaded carrier support member into a reactor chamber;
    d) depositing, using a chemical vapor deposition process, a coating material on the spherical outer surface of each spherical member, the deposition performed at a temperature and for a time sufficient to form an essentially uniform coating of a desired thickness.

2. A coating method as defined in claim 1 wherein in performing step d), depositing an anti-reflective coating material as the coating material.

3. A coating method as defined in claim 2 wherein in performing step d), depositing a coating of silicon dioxide.

4. A coating method as defined in claim 3 wherein in performing step d), DADBS is utilized to form the silicon dioxide.

5. A coating method as defined in claim 1 wherein in performing step d), the deposition temperature is approximately 500° C.

6. A coating method as defined in claim 1 wherein in performing step d), the deposition is performed for a time sufficient to form a coating in the range of 2000–3000Å.

7. A coating method as defined in claim 1 wherein the time is in the range of 20–30 minutes.

8. A coating method as defined in claim 1, wherein in performing step d), depositing a reflective coating.

9. A coating method as defined in claim 8 wherein in performing step d), depositing a metallic coating from an organo-metallic precursor.

10. A coating method as defined in claim 8 wherein in performing step d), aluminum is deposited.

11. A coating method as defined in claim 1 wherein in performing step b), the intersecting trenches are hi-level in form, comprising a lower trench of width $w_1$ and an upper trench of width $w_2$, where $w_1 < w_2$.

12. A coating method as defined in claim 1 wherein in performing step a), a plurality of sapphire lenses is provided.

13. A coating method as defined in claim 14 wherein in performing step d), depositing an anti-reflective coating material.

* * * * *